United States Patent
Fuller et al.

(10) Patent No.: US 12,096,602 B2
(45) Date of Patent: Sep. 17, 2024

(54) COOLING SYSTEM IN ELECTRONICS CABINET COMPRISING THERMALLY COUPLED COOLING CIRCUITS

(71) Applicant: Pfannenberg GmbH, Hamburg (DE)

(72) Inventors: Russell Fuller, Lancaster, NY (US); Peter Starp, Hamburg (DE); William Baron, Buffalo, NY (US)

(73) Assignee: PFANNENBERG GMBH, Hamburg (DE)

( * ) Notice: Subject to any disclaimer, the term of this patent is extended or adjusted under 35 U.S.C. 154(b) by 238 days.

(21) Appl. No.: 16/842,918

(22) Filed: Apr. 8, 2020

(65) Prior Publication Data
US 2020/0329586 A1 Oct. 15, 2020

(30) Foreign Application Priority Data
Apr. 9, 2019 (EP) ..................... 19168029

(51) Int. Cl.
*H05K 7/00* (2006.01)
*H05K 7/20* (2006.01)

(52) U.S. Cl.
CPC ..... *H05K 7/20681* (2013.01); *H05K 7/20245* (2013.01); *H05K 7/20281* (2013.01); *H05K 7/20309* (2013.01); *H05K 7/20318* (2013.01); *H05K 7/20336* (2013.01); *H05K 7/20381* (2013.01); *H05K 7/207* (2013.01)

(58) Field of Classification Search
CPC .......... H05K 7/20572; H05K 7/20609; H05K 7/20681; H05K 7/20736; H05K 7/20818; H05K 7/20245; H05K 7/20281; H05K 7/20309; H05K 7/20318; H05K 7/20336; H05K 7/20381; H05K 7/207; H05K 7/20354
See application file for complete search history.

(56) References Cited

U.S. PATENT DOCUMENTS

| 5,806,583 A | 9/1998 | Suzuki | |
|---|---|---|---|
| 6,026,891 A * | 2/2000 | Fujiyoshi | F28D 15/0266 165/104.34 |
| 6,828,675 B2 * | 12/2004 | Memory | H05K 7/20681 361/700 |

(Continued)

FOREIGN PATENT DOCUMENTS

| CN | 1409589 | 4/2003 | |
|---|---|---|---|
| WO | WO-2011134786 A1 * | 11/2011 | ........... F28D 1/0426 |

OTHER PUBLICATIONS

European Search Report dated Oct. 8, 2019 from related European Application No. 19168029.

(Continued)

*Primary Examiner* — Travis Ruby
(74) *Attorney, Agent, or Firm* — Grogan, Tuccillo & Vanderleeden LLP

(57) ABSTRACT

A cooling system, in particular for electronics cabinets, is proposed, comprising a casing, wherein the casing comprises at least a cabinet side partitionment, wherein the cooling system comprises a first cooling circuit and a second cooling circuit, wherein the second cooling circuit is an active cooling circuit, wherein the first cooling circuit and the second cooling circuit are thermally coupled, wherein the second cooling circuit is not disposed in the cabinet side partitionment.

9 Claims, 12 Drawing Sheets

(56) References Cited

U.S. PATENT DOCUMENTS

| | | | | |
|---|---|---|---|---|
| 7,826,217 | B2* | 11/2010 | Kondo | H05K 7/20781 |
| | | | | 361/700 |
| 9,970,668 | B2* | 5/2018 | Kimura | H05K 7/20309 |
| 2001/0042614 | A1 | 11/2001 | Okamoto | |
| 2007/0151707 | A1* | 7/2007 | Lyons | H05K 7/20145 |
| | | | | 165/104.21 |
| 2015/0163956 | A1* | 6/2015 | Cacho Alonso | H05K 7/206 |
| | | | | 165/104.14 |
| 2015/0296665 | A1 | 10/2015 | Cacho Alonso | |
| 2015/0319885 | A1* | 11/2015 | Uehara | F24F 1/18 |
| | | | | 361/700 |
| 2017/0280593 | A1* | 9/2017 | Magallanes | H05K 7/20818 |
| 2017/0311487 | A1* | 10/2017 | Rau | H05K 7/20772 |
| 2018/0368292 | A1* | 12/2018 | Agostini | H05K 7/20327 |

OTHER PUBLICATIONS

Defining "Low GWP" written by Pavel Makhnatch published Nov. 4, 2013.
Chinese Office Action dated Mar. 9, 2023 from corresponding Chinese Application No. 202010259744.0.

* cited by examiner

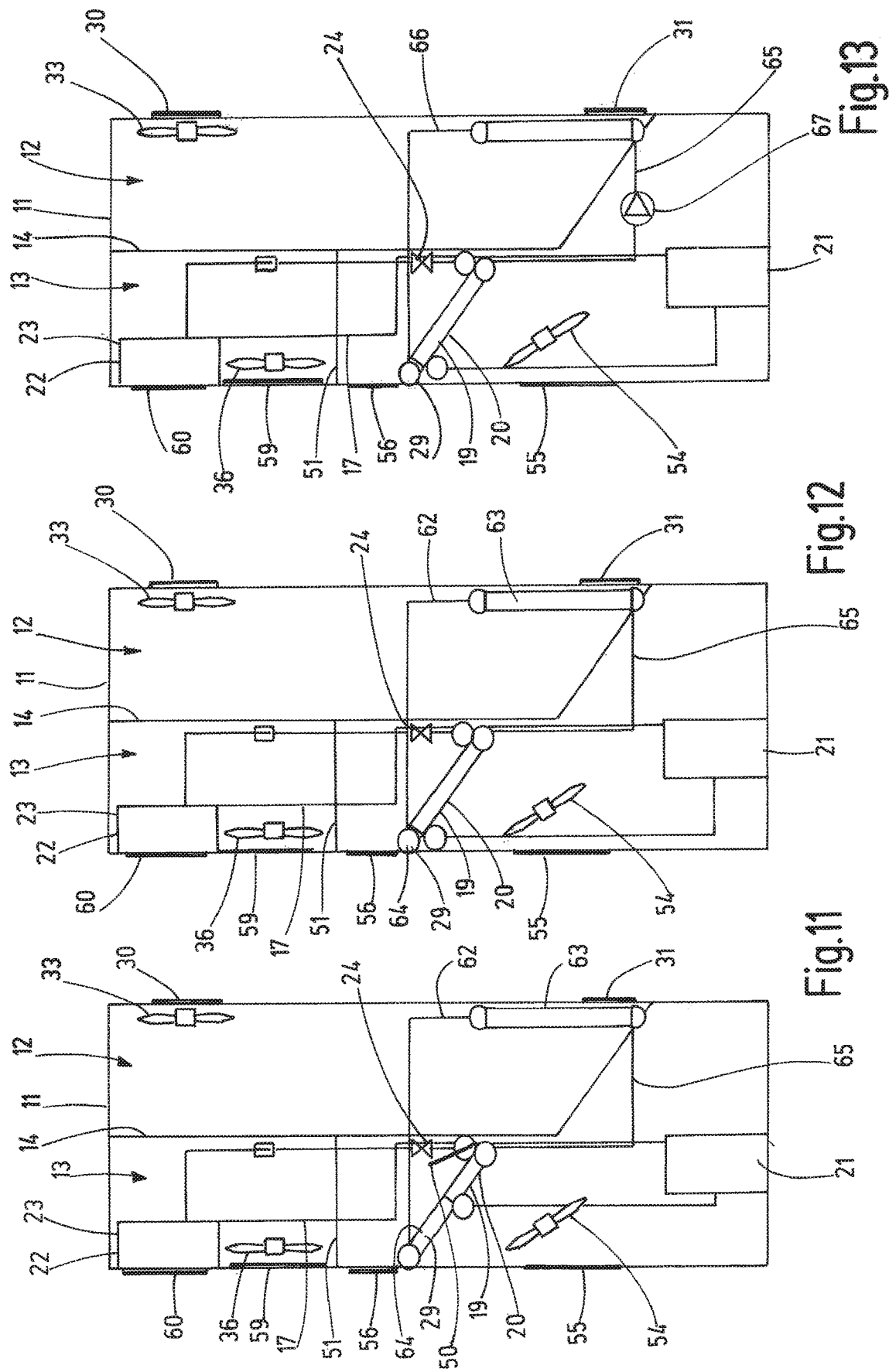

COOLING SYSTEM IN ELECTRONICS CABINET COMPRISING THERMALLY COUPLED COOLING CIRCUITS

CROSS REFERENCE TO RELATED APPLICATION

This application claims priority to European Patent Application No. 19168029.7 filed on Apr. 9, 2019, which is hereby incorporated by reference herein in its entity.

The present invention relates to a cooling system, in particular for electronics cabinets, comprising a first cooling circuit and a second cooling circuit. Furthermore, the present invention relates to a method for cooling an electronics cabinet.

TECHNOLOGICAL BACKGROUND

Cooling system are used in a wide range of technical applications. One particular example is the use of cooling systems for cooling electronics cabinets such as switchboards, control cabinets, enclosure systems or computer systems, or generally for any housing enclosing heat producing components. Such cooling systems usually comprise a cooling circuit, which can either be configured as a passive cooling circuit or as an active cooling circuit.

Prior art document DE 10 2012 108 110 B4 discloses a cooling arrangement for the interior of an electronics cabinets comprising a first cooling circuit and a second cooling circuit, which is fluidically separated from the first cooling circuit.

For environmental protection reasons it has become desirable to use refrigerants or coolants with a low Global Warming Potential (GWP) in cooling systems. However, most refrigerants or coolants with a low GWP such as propane are combustible, inflammable or harmful substances. This poses a problem in particular in cooling systems for electronics cabinets because the comparatively small interior volume of electronic cabinets prohibits the use of combustible or inflammable coolants or refrigerants because of the risk of spark ignition in case of leakage of the combustible or inflammable coolant or refrigerant into the electronics cabinet.

Therefore, there is a need in the art for a cooling system, in particular for electronics cabinets, which provides an effective cooling and allows the use of coolants or refrigerants with a very low GWP.

Description of the Invention: Object, Solution, Advantages

It is an object of the present invention to provide a cooling system, in particular for electronics cabinets, which provides an effective and environmental friendly cooling and which furthermore satisfies Ingress Protection requirements. It is furthermore an object of the present invention to provide a method for cooling an electronics cabinet, which provides these benefits.

To solve the object of the invention a cooling system, in particular for electronics cabinets, is being proposed, comprising a casing, wherein the casing comprises at least a cabinet side partitionment, wherein the cooling system comprises a first cooling circuit and a second cooling circuit, wherein the second cooling circuit is an active cooling circuit, wherein the first cooling circuit and the second cooling circuit are thermally coupled, wherein the second cooling circuit is not disposed in the cabinet side partitionment.

The inventive cooling system is suitable for any housing enclosing heat producing components, in particular for electronics cabinets such as switchboards, control cabinets, enclosure systems or computer systems.

In the context of the present invention an active cooling circuit is a cooling circuit that involves the use of energy to transfer heat from a region of lower temperature to a region of higher temperature. An example for an active cooling system is a vapor compression cycle cooling system. Thus, an active cooling system is a cooling system that may comprise a compressor or the like. In contrast, a passive cooling system is a cooling system that transfers heat from a region of higher temperature to a region of lower temperature spontaneously. Examples of passive cooling systems are heat pipes, thermosiphons, pulsating heat pipes or water cooling systems. Passive cooling systems may include components requiring auxiliary energy such as fans or, in particular in the case of water cooling systems, pumps to circulate a coolant. However, the auxiliary energy used in these systems is only required to drive those supporting components, while the heat flow is strictly passive and spontaneous from the region of higher temperature to the region of lower temperature.

The cooling system comprises a casing with at least a cabinet side partitionment. The cabinet side partitionment is preferably configured to be fluidically connected to the interior of a housing comprising heat producing components. The housing comprising heat producing components is preferably an electronics cabinet. Heated air from the interior of the housing can be circulated through the cabinet side partitionment to transfer heat to a heat absorbing heat exchanger section of the first cooling circuit.

According to the invention the second cooling circuit is not disposed in the cabinet side partitionment. Therefore, in case of a leakage of a coolant or refrigerant of the second cooling circuit the leaked coolant or refrigerant does not enter the interior of the housing comprising the heat producing components. Thus, the risk of spark ignition of the leaked coolant or refrigerant is reduced and it is possible to use a refrigerant or coolant with a low GWP and/or a combustible, inflammable or harmful refrigerant or coolant in the second cooling circuit.

The second cooling circuit is thermally coupled to the first cooling circuit. For example, a heat absorbing heat exchanger section of the second cooling circuit, which is not disposed in the cabinet side partitionment, can be thermally coupled to a heat releasing heat exchanger section of the first cooling circuit, in which case the heat releasing heat exchanger section of the first cooling circuit is preferably also not disposed in the cabinet side partitionment. Thus, heat absorbed from a heat absorbing heat exchanger section of the first cooling circuit in the cabinet side partitionment is transferred via the heat releasing heat exchanger section of the first cooling circuit outside the cabinet side partitionment to the heat absorbing heat exchanger section of the second cooling circuit.

Preferably the first cooling circuit is a passive cooling circuit or an active cooling circuit. When the first cooling circuit is a passive cooling circuit the energy consumption of the cooling system is reduced.

The second cooling circuit may comprise a refrigerant or coolant with a Global Warming Potential (GWP) of less than 1.000, preferable of less than 100, more preferably of less than 10, further preferably of less than 5, still further preferably of less than 3.

Still further preferably the second cooling circuit can comprise a combustible or inflammable or harmful refrigerant or coolant.

The refrigerant or the coolant may be a hydrocarbon, for example a polyolefin or an alkane, in particular propane, propene or isobutane. Other coolants or refrigerants can be used in the second cooling circuit as well.

Because the second cooling circuit is not disposed in the cabinet side partitionment and because of the thermal coupling of the second cooling circuit with the first cooling circuit, a combustible or harmful refrigerant or coolant, such as propane, can be used in the cooling system for an effective and environmental friendly cooling of a spark ignition vulnerable apparatus, such as an electronic cabinets.

Preferably the second cooling circuit is a vapor compression cycle circuit or a chiller.

Another name for a vapor compression cycle circuit is refrigeration circuit. A vapor compression cycle circuit comprises an evaporator as a heat absorbing heat exchanger section, a condenser as a heat releasing heat exchanger section, a compressor and an expansion valve as well as fluid lines for a refrigerant. Preferably all components of the second cooling circuit are not disposed in the cabinet side partitionment. All the components of the second cooling circuit can be disposed outside of the cabinet side partitionment and, furthermore, even outside of the casing of the cooling system. It is, however also possible that the casing of the cooling system comprises an external side partitionment, in which the second cooling system is arranged.

Preferably the first cooling circuit is a fluid cooling circuit, in particular a water cooling circuit, or a heat pipe, a thermosiphon or a pulsating heat pipe (PHP).

Also, the first cooling circuit can be configured as an adsorption cooling circuit or an absorption cooling circuit.

It is, however, particularly preferred that the first cooling circuit is a heat pipe, a thermosiphon or a pulsating heat pipe.

The second cooling circuit can comprise a heat absorbing heat exchanger section, in particular an evaporator, and the first cooling circuit can comprise a heat releasing heat exchanger section, in particular a condenser, wherein the heat absorbing heat exchanger section of the second cooling circuit is thermally coupled to the heat releasing heat exchanger section of the first cooling circuit.

In a particular preferred embodiment, the second cooling circuit is a vapor compression cycle circuit and the first cooling circuit is a heat pipe, thermosiphon or pulsating heat pipe. The heat absorbing heat exchanger section and the heat releasing heat exchanger section of the first cooling circuit may be physically separated and preferably connected via fluid lines. However, the heat absorbing heat exchanger section and the heat releasing heat exchanger section of the first cooling circuit may be directly connected to each other without the use of fluid lines. Such a configuration is in particular advantageous if the first cooling circuit is a heat pipe or pulsating heat pipe, allowing for a compact design.

The evaporator of the vapor compression cycle circuit can be thermally coupled to the condenser of the heat pipe, thermosiphon or pulsating heat pipe. The condenser of the heat pipe, thermosiphon or pulsating heat pipe is cooled by the evaporator of the vapor compression cycle circuit when the vapor compression cycle circuit is operated, thereby increasing the effectivity of the first cooling circuit.

Preferably the heat absorbing heat exchanger section of the second cooling circuit and the heat releasing heat exchanger section of the first cooling circuit form a heat exchanger arrangement, wherein the heat exchanger arrangement comprises a plurality of heat exchange structures which are arranged, preferably in parallel to each other, in a plane of extension, wherein the heat absorbing heat exchanger section of the second cooling circuit comprises a first plurality of fluid guiding means and wherein the heat releasing heat exchanger section of the first cooling circuit comprises a second plurality of fluid guiding means, wherein each heat exchange structure comprises at least one fluid guiding means of the first plurality and at least one fluid guiding means of the second plurality thermally coupled to each other, and preferably arranged in parallel to each other, wherein a clearance is disposed between two adjacent heat exchange structures to allow airflow between the adjacent heat exchange structures and/or wherein each heat exchange structure comprises a heat sink to thermally couple the at least one fluid guiding means of the first plurality and the at least one fluid guiding means of the second plurality.

Such a heat exchanger arrangement and preferred embodiments thereof are disclosed in more detail in the European patent application no. 19168012.3 of the applicant. The contents of the European patent application no. 19168012.3 are hereby incorporated by reference and any heat exchanger arrangement disclosed in European patent application no. 19168012.3 can be used in the proposed cooling system of the present invention.

Preferably the first cooling circuit comprises a heat absorbing heat exchanger section, in particular an evaporator.

Further preferably, the thermal coupling between the fluid guiding means of the first plurality and the fluid guiding means of the second plurality extends over a part or over a full length of the heat releasing heat exchanger section of the first cooling circuit.

Still further preferably the heat exchanger arrangement, and/or the heat absorbing heat exchanger section, in particular the evaporator, of the second circuit and/or the heat releasing heat exchanger section, in particular the condenser, of the first cooling circuit comprises an airflow regulation flap which in a closed position at least partially prevents airflow through the clearances between adjacent heat exchange structures.

The casing of the cooling system may comprise an external side partitionment separated by a, preferably gas tight, internal partition wall from the cabinet side partitionment and the heat absorbing heat exchanger section of the second cooling circuit may be disposed only in the external side partitionment.

The external side partitionment can be fluidically connected to an outside or to an external side of the electronics cabinet, for example by inlet openings and outlet openings, so that ambient air can circulate through the external side partitionment.

Furthermore preferably, the heat releasing heat exchanger section, in particular the condenser, of the first cooling circuit is disposed in the external side partitionment and the heat absorbing heat exchanger section, in particular the evaporator, of the first cooling circuit is arranged in the cabinet side partitionment.

Preferably, the cabinet side partitionment comprises an inlet opening for inflow of air from an interior of an electronics cabinet and an outlet opening for outflow of air into the electronics cabinet and/or the external side partitionment may comprise at least one inlet opening for inflow of air from an external side and at least one outlet opening for outflow of air to the external side of the electronics cabinet.

In particular, the external side partitionment may comprise two inlet openings and/or two outlet openings.

Preferably the external side partitionment comprises a separation wall, separating the external side partitionment into a first volume and a second volume, or a shutter flap, which in a closed position separates the external side partitionment into a first volume and a second volume. Preferably the heat absorbing heat exchanger section of the second cooling circuit and/or the heat releasing heat exchanger section of the first cooling circuit is/are arranged in the first volume and the heat releasing heat exchanger section of the second cooling circuit is arranged in the second volume.

Particular preferably, the heat absorbing heat exchanger section of the first cooling circuit is only disposed in the cabinet side partitionment of the casing. The heat releasing heat exchanger section of the first cooling circuit and the heat absorbing heat exchanger section of the second cooling circuit are only disposed in the first volume of the external side partitionment and the heat releasing heat exchanger section of the second cooling circuit is only disposed in the second volume of the external side partitionment of the casing of the cooling system.

Preferably, the cooling system can be operated in different and advantageous cooling modi.

In a first cooling mode, also called the passive cooling mode, the second cooling circuit, which is preferably configured as an active cooling circuit such as a vapor compression cycle circuit, is not operated. Thus, in this mode heat from the electronics cabinet is absorbed by the heat absorbing heat exchanger section of the first cooling circuit disposed in the cabinet side partitionment and transferred to the heat releasing heat exchanger section of the first cooling circuit in the external side partitionment, where it is released to the ambient air. In the passive cooling mode, it is in particular advantageous when the cooling system comprises a heat exchanger arrangement as described above and/or in European patent application no. 19168012.3, wherein the heat exchanger arrangement comprising the heat absorbing heat exchanger section of the second cooling circuit and the heat releasing heat exchanger section of the first cooling comprises clearances between adjacent heat exchange structures to allow airflow between the adjacent heat exchange structures.

The first or passive cooling mode is preferably chosen when an external or ambient temperature $T_{ex}$ is lower than an internal temperature $T_{in}$ of the electronics cabinet or the cabinet side partitionment. In an illustrative example, the first cooling circuit is configured as a pulsating heat pipe and the second cooling circuit is configured as a vapor compression cycle circuit or chiller. Assuming an ambient temperature $T_{ex}$ is 25° C. and an interior temperature $T_{in}$ is 35° C., the temperature difference of 10° C. is sufficient to transfer the heat from the electronics cabinet passively via the pulsating heat pipe. In this case, the refrigerant temperature in the pulsating heat pipe may adjust itself to 30° C. With an airflow through the clearances in the preferred heat exchanger arrangement, the effectivity of the heat transfer from the heat releasing heat exchanger section of the first cooling circuit, in particular of the heat pipe, to the ambient or external air is increased.

In a second mode, also called the hybrid mode, both the first cooling circuit and the second cooling circuit are operated. The hybrid mode is in particular advantageous when the first cooling circuit is a passive cooling circuit such as a pulsating heat pipe and when the second cooling circuit is an active cooling mode, for example a vapor compression cycle circuit. The hybrid mode is explained in the following with regard to such a configuration.

The second cooling mode or hybrid mode can be chosen, when the external temperature $T_{ex}$ is lower than an interior temperature $T_{in}$ of the electronics cabinet or the cabinet side partitionment. In the hybrid mode an evaporation temperature $T_{evap}$ of the refrigerant in the active second cooling circuit may be higher or lower than the exterior temperature $T_{ex}$. In the following, first the case of an evaporation temperature $T_{evap}$ being higher than the exterior temperature $T_{ex}$ is described.

The evaporation temperature $T_{evap}$ can be adjusted to be higher than the exterior temperature $T_{ex}$ by setting the operating parameters of the compressor of the second cooling circuit. In the hybrid mode with $T_{evap}$ being higher than $T_{ex}$ the heat absorbing heat exchanger section of the second cooling circuit does not absorb heat from the ambient or external air in the external side partitionment absorbing heat exchanger section. However, the heat absorbing heat exchanger section of the second cooling circuit cools the heat releasing heat exchanger section of the first cooling circuit, thereby increasing the cooling effectivity of the first cooling circuit.

Thus, in addition to the dissipation of heat to the ambient air via the heat releasing heat exchanger section of the first cooling circuit, the heat releasing heat exchanger section of the first cooling circuit is actively cooled by the heat absorbing heat exchanger section of the second cooling circuit and heat is released to the ambient air via the heat releasing heat exchanger section of the second cooling circuit. The hybrid mode is in particular advantageous when the ambient temperature $T_{ex}$ is lower than the internal temperature $T_{in}$, but when the temperature difference between the ambient temperature and the internal temperature is not sufficient for the first cooling circuit to operate effectively. Considering the illustrative example, the hybrid mode would be advantageous when the interior temperature $T_{in}$ is 35° C. and the exterior temperature $T_{ex}$ is 31° C. In this case, the temperature difference of 4° C., however, could be too small for the pulsating heat pipe to operate effectively. By operating the active second cooling circuit, the evaporator of the second cooling circuit, which is thermally coupled to the condenser of the pulsating heat pipe, cools the refrigerant or coolant in the pulsating heat pipe, so that the temperature $T_{HP}$ of the refrigerant or coolant is lowered. Since the temperature $T_{HP}$ of the refrigerant or coolant in the pulsating heat pipe is substantially homogeneous in the pulsating heat pipe, the evaporator of the pulsating heat pipe is effectively cooled as well, increasing the temperature difference between the refrigerant or coolant temperature $T_{HP}$ and the interior temperature $T_{in}$. This increase in the temperature difference increases the effectivity of the heat absorption of the pulsating heat pipe and the transfer of the heat to the exterior. The evaporation temperature $T_{evap}$ of the refrigerant in the evaporator of the second cooling circuit either already is or is preferably adjusted to be higher than the ambient temperature $T_{ex}$. The adjustment of the evaporation temperature $T_{evap}$ can be done by adjusting the operating parameters of the second cooling circuit, for example of the compressor. In the example the evaporation temperature $T_{evap}$ may be adjusted to 31.5° C. to prevent heat absorption of the ambient air by the evaporator of the second cooling circuit.

The hybrid mode may also be expedient when the external temperature $T_{ex}$ is lower than the interior temperature $T_{in}$ of the electronics cabinet or the cabinet side partitionment, while the evaporation temperature $T_{evap}$ of the refrigerant in the active second cooling circuit is lower than the exterior temperature $T_{ex}$. In this case, the evaporator of the second cooling circuit still cools the coolant in the pulsating heat pipe, so that the temperature difference between the coolant temperature $T_{HP}$ and the interior temperature $T_{in}$ is increased. However, since the evaporation temperature $T_{evap}$ of the refrigerant in the active second cooling circuit is lower than the exterior temperature $T_{ex}$ heat is also absorbed by the evaporator of the second cooling circuit from the ambient air.

If present, the airflow regulation flap of the heat exchanger arrangement can be closed to prevent airflow between the heat exchange structures of the heat exchanger arrangement, thereby effectively preventing heat transfer from the ambient air to the evaporator of the second cooling circuit. With the closed airflow regulation flap, the evaporator of the second cooling circuit is thermally insulated from the ambient air, so that the hybrid mode can be used, when the external temperature $T_{ex}$ is higher than the evaporation temperature $T_{evap}$ without the disadvantage, that the evaporator of the second cooling circuit cools the ambient or external air.

In a third cooling mode, also called active mode, both the first and the second cooling circuit are operated, but heat is not dissipated from the heat releasing heat exchanger section of the first cooling circuit to the ambient air. The active mode is advantageous, when the ambient temperature $T_{ex}$ is higher than the internal temperature $T_{in}$. Concerning the illustrative example, the interior temperature $T_{in}$ might be 35° C. and the ambient temperature $T_{ex}$ 40° C. The evaporation temperature $T_{evap}$ of the refrigerant in the evaporator of the second cooling circuit is or is adjusted to e.g. 15° C., and the temperature $T_{HP}$ of the refrigerant of the heat pipe may be 20° C. Since the ambient temperature $T_{ex}$ is higher than the interior temperature $T_{in}$ and the temperature of the refrigerant in the heat pipe, no heat is dissipated from the heat pipe to the ambient air, and heat is released only from the heat releasing heat exchanger section of the second cooling circuit.

The person of ordinary skill in the art will understand, that the preceding temperatures and temperature ranges are only illustrative in nature. The cooling system might be operated in the three modi at other temperatures and temperature ranges. Furthermore, it has to be understood, that the cooling system is not necessarily configured to be operated in the hybrid mode, since the operating conditions for the hybrid mode are often not realized or realizable.

In particular in the hybrid mode, the separation of the external side partitionment into a first volume and a second volume is advantageous. When the heat releasing heat exchanger section of the first cooling circuit is disposed in the first volume and the heat releasing heat exchanger section of the second cooling circuit is disposed in the second volume, heat released from the heat releasing heat exchanger section of the first cooling circuit does not influence the effectivity of the heat transfer from the heat releasing heat exchanger section of the second cooling circuit and vice versa.

Preferably the first volume and/or the second volume each have a respective outlet opening and a respective inlet opening.

The shutter flap can be configured in such a way that it closes the inlet opening of the second volume in the open position.

Furthermore, the external side partitionment, in particular the first volume and/or the second volume, may comprise a fan, and/or the cabinet side partitionment may comprises a fan.

Preferably, at least one fan is arranged in a part of the external side partitionment, which becomes the second volume when the shutter flap is closed.

The cooling circuit system can furthermore comprise a third cooling circuit wherein the third cooling circuit is preferably configured as a heat pipe, a thermosiphon or a pulsating heat pipe.

Still further preferably a heat absorbing heat exchanger section of the third cooling circuit is arranged in the cabinet side partitionment in flow direction of the airflow in front of the heat absorbing heat exchanger section of the first cooling circuit and/or a heat releasing heat exchanger section of the third cooling circuit is arranged in the external side partitionment in flow direction of the airflow behind the heat releasing heat exchanger section of the first cooling circuit and/or behind the heat absorbing heat exchanger section of the second cooling circuit.

The provision of a third cooling circuit is particularly advantageous when the heat releasing heat exchanger section of the first cooling circuit and the heat absorbing heat exchanger section of the second cooling circuit are comprised in a heat exchanger arrangement as described above and disclosed in European patent application no. 19168012.3, wherein each heat exchange structure of the heat exchanger arrangement comprises a heat sink to thermally couple the at least one fluid guiding means of the first plurality and the at least one fluid guiding means of the second plurality, and wherein the heat sinks are preferably disposed such that no clearances between the heat exchange structures are present for air to flow between the heat exchange structures.

Preferably the third heat exchanger is configured as a heat pipe, a thermosiphon or a pulsating heat pipe.

A further solution to the object of the present invention is the provision of a method for cooling an electronics cabinet carried out with a cooling system as described above, wherein the cooling system is selectively operated in at least one of a first mode, in particular in a passive mode, a second mode, in particular a hybrid mode, or a third mode, in particular an active mode.

The cooling system for carrying out the method can be configured according to any of the embodiments of the cooling system described above. Furthermore, any one of the features described in connection with the cooling system can be applied to the method for cooling an electronics cabinet.

Preferably an internal temperature $T_{in}$ is measured in the electronics cabinet and/or in the cabinet side partitionment, and an external temperature $T_{ex}$ is measured on the external side and/or in the external side partitionment, and the first mode is activated when the internal temperature $T_{in}$ is higher than the external temperature $T_{ex}$, and/or the second mode is activated when the internal temperature $T_{in}$ is higher than the external temperature $T_{ex}$ and the external temperature $T_{ex}$ is higher or preferably lower than an evaporation temperature $T_{evap}$ of the refrigerant in the second cooling circuit, and/or the third mode is activated when the internal temperature $T_{in}$ is lower than the external temperature $T_{ex}$.

The evaporation temperature $T_{evap}$ of the refrigerant in the second cooling circuit can be adjusted to be higher than the external temperature $T_{ex}$, for example in case the second cooling circuit is a vapor compression cycle circuit by adjusting the operating parameters of the compressor.

In a preferred embodiment of the method in the first mode only the first cooling circuit and/or the third cooling circuit is/are operated, and/or in the second mode and/or in the third mode the first cooling circuit and the second cooling circuit and preferably the third cooling circuit are operated.

Preferably in the first mode the shutter flap is in an open position, and/or the flow regulation flap is in an open position, and/or at least one fan in the external side partitionment, in particular in the first volume and/or the second volume, and or the cabinet side partitionment is operated.

Preferably, in the second mode the shutter flap is in an open position, and/or the airflow regulation flap is in an open position or in a closed position, and/or at least one fan in the external side partitionment, in particular in the first volume and/or the second volume, and or the cabinet side partitionment is operated.

By closing the airflow regulation flap airflow through the heat absorbing heat exchanger section of the second cooling circuit, in particular through the clearances between the heat exchange structures of the heat exchanger arrangement, is prevented. Without an airflow through the clearances the heat absorbing heat exchanger section of the second cooling circuit is effectively thermally insulated from the external or ambient air, and heat from the ambient or external air is not absorbed by the heat absorbing heat exchanger section of the second cooling circuit. This allows operation of the cooling system in the second or hybrid mode, even if the evaporation temperature $T_{evap}$ is lower than the external temperature $T_{ex}$.

Preferably in the third mode the shutter flap is in a closed position, and/or the airflow regulation flap is in a closed position, and/or at least one fan in the external side partitionment, in particular in the first volume and/or the second volume, and/or the cabinet side partitionment is operated.

A still further solution to the object of the present invention is the provision of an electronics cabinet with a cooling system as described above.

BRIEF DESCRIPTION OF THE FIGURES

The present invention is described in more detail in reference to the accompanying figures.

FIG. 11 shows a fourth configuration of the cooling system comprising a thermosiphon and an airflow regulation flap, FIG. 12 shows a fifth configuration of the cooling system comprising a thermosiphon, FIG. 13 shows a sixth configuration of the cooling system comprising a water cooling circuit.

DETAILED DESCRIPTION OF THE FIGURES

Figure 1:
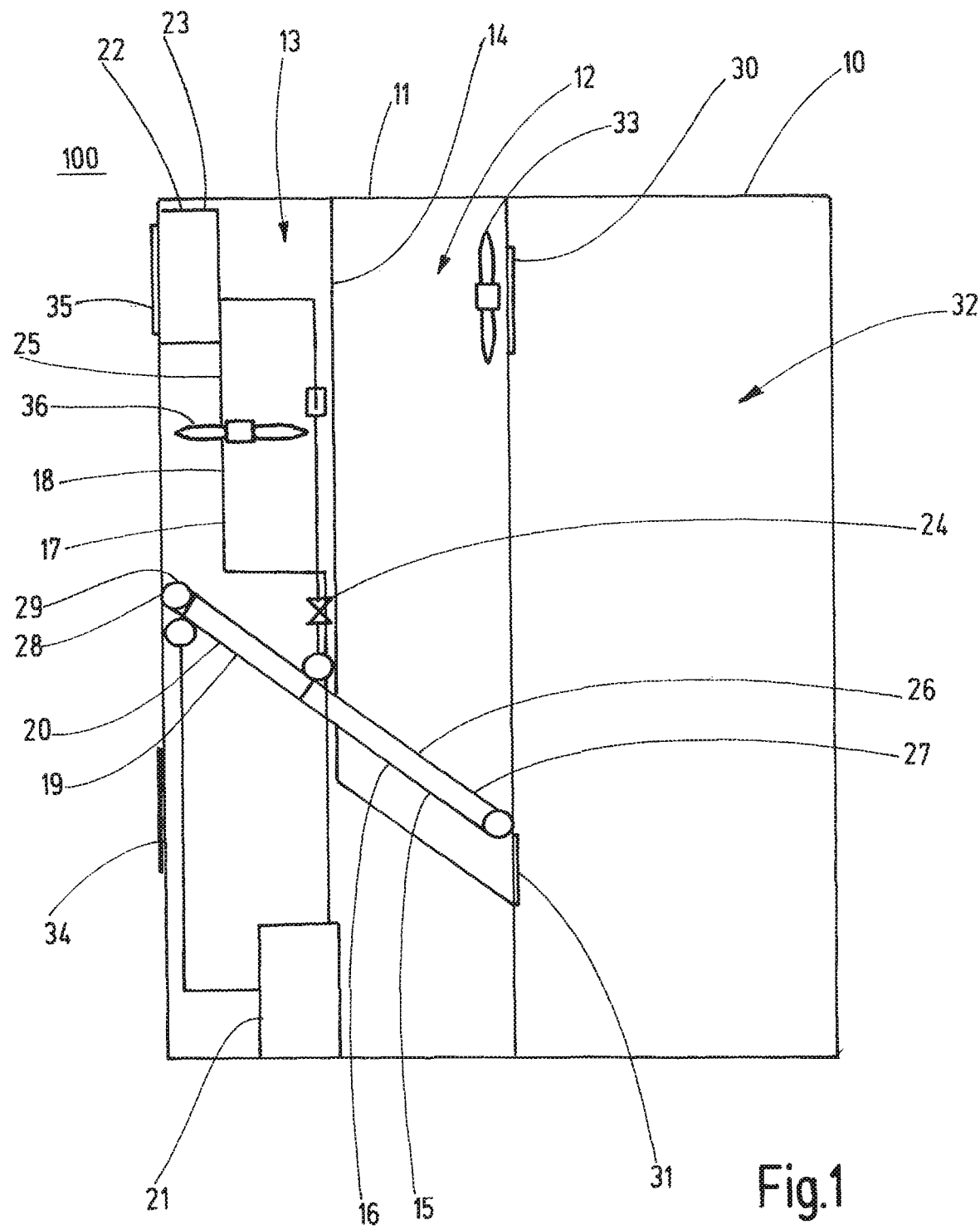
FIG. 1 shows a first configuration of a cooling system.

FIG. 1 shows a cooling system 100 for an electronics cabinet 10. The cooling system 100 comprises a casing 11. The casing 11 is divided into a cabinet side partitionment 12 and an external side partitionment 13 by an internal and preferably substantially gas tight partition wall 14. The cooling system 100 comprises a first cooling circuit 15 configured as a pulsating heat pipe 16 and a second cooling circuit 17 configured as a vapor compression cycle circuit 18. The second cooling circuit 17, in particular the vapor compression cycle circuit 18, comprises evaporator 19 as a heat absorbing heat exchanger section 20, compressor 21, condenser 22 as a heat releasing heat exchanger section 23, expansion valve 24 and fluid lines 25. The pulsating heat pipe 16 of the first cooling circuit 15 comprises an evaporator 26 as a heat absorbing heat exchanger section 27 and a condenser 28 as a heat releasing heat exchanger section 29. The condenser 28 of the pulsating heat pipe 16 is thermally coupled to the evaporator 19 of the vapor compression cycle circuit 18. All components of second cooling circuit 17, i.e. the vapor compression cycle circuit 18, are disposed in the external side partitionment 13 so that the second cooling circuit 17 is not disposed in the cabinet side partitionment 12. Evaporator 26 of the pulsating heat pipe 16 is only disposed in the cabinet side partitionment 12, while condenser 28 of the pulsating heat pipe 16 is only disposed in the external side partitionment 13.

The cabinet side partitionment 12 includes an inlet opening 30 and an outlet opening 31 for air from the interior 32 of the electronics cabinet 10 to enter and exit the cabinet side partitionment 12. To circulate the air through the cabinet side partitionment 12 a first fan 33 is disposed inside the cabinet side partitionment 12.

The external side partitionment 13 also comprises an inlet opening 34 and an outlet opening 35. Ambient air from outside of the electronics cabinet 10 circulates through the external side partitionment 13 via inlet opening 34 and outlet opening 35. To circulate the ambient air through the external side partitionment 13 a second fan 36 is disposed inside the external side partitionment 13.

The partition wall 14 is configured gas tight so that the airflows inside the external side partitionment 13 and the cabinet side partitionment 12 are fluidically separated from each other. The vapor compression cycle circuit 18 of the second cooling circuit 17 comprises a refrigerant with a low Global Warming Potential (GWP), which may be flammable, for example propane. The refrigerant in the pulsating heat pipe 16 is a non-flammable or incombustible refrigerant such as R134a.

Figure 2:
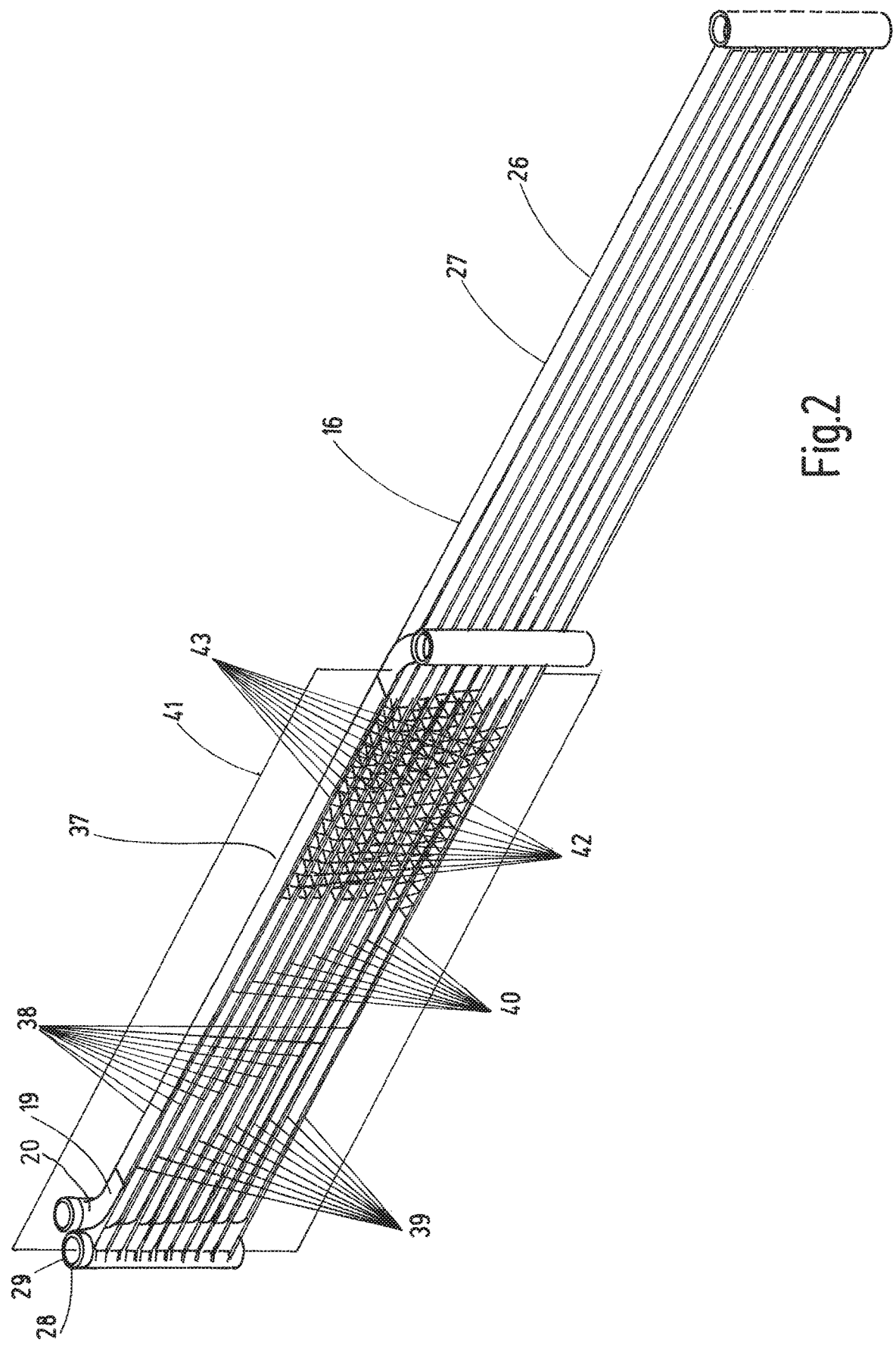
FIG. 2 shows a first configuration of a heat exchanger arrangement for a cooling system.

FIG. 2 shows a heat exchanger arrangement 37 suitable for the cooling system 100 of FIG. 1. The heat exchanger arrangement 37 comprises a pulsating heat pipe 16 with a heat absorbing heat exchanger section 27 configured as an evaporator 26 and a heat releasing heat exchanger section 29 configured as a condenser 28. Condenser 28 of the pulsating heat pipe 16 is thermally coupled to evaporator 19 of second cooling circuit 17. For the thermal coupling the evaporator 19 of the second cooling circuit 17 comprises a first plurality of stripe-like fluid guiding means 38. The condenser 28 of the first cooling circuit 15 comprises a second plurality of stripe-like fluid guiding means 39. The fluid guiding means 38 of the first plurality and the fluid guiding means 39 of the second plurality are in face-to-face thermal contact with each other. One fluid guiding means 38 of the first plurality and one fluid guiding means 39 of the second plurality form a respective heat exchange structure 40. The heat exchange structures are arranged parallel to each other in an imagined plane of extension 41. Between adjacent heat exchange structures 40 clearances 42 are provided in which pleated cooling fins 43 are arranged for interconnecting the heat exchange structures 40. Heat absorbed in the evaporator 26 of the pulsating heat pipe 16 is transferred to the condenser 28 of the pulsating heat pipe 16 and transferred via the thermal coupling to the evaporator 19 of the second cooling circuit 17. In addition, heat can be transferred to an airflow through the clearances 42 from the fluid guiding means 38 of the second plurality of the condenser 28 of pulsating heat pipe 16.

A more detailed description of the heat exchanger arrangement 37 according to FIG. 2 is provided in European patent application no. 19168012.3 of the applicant.

Figure 3:
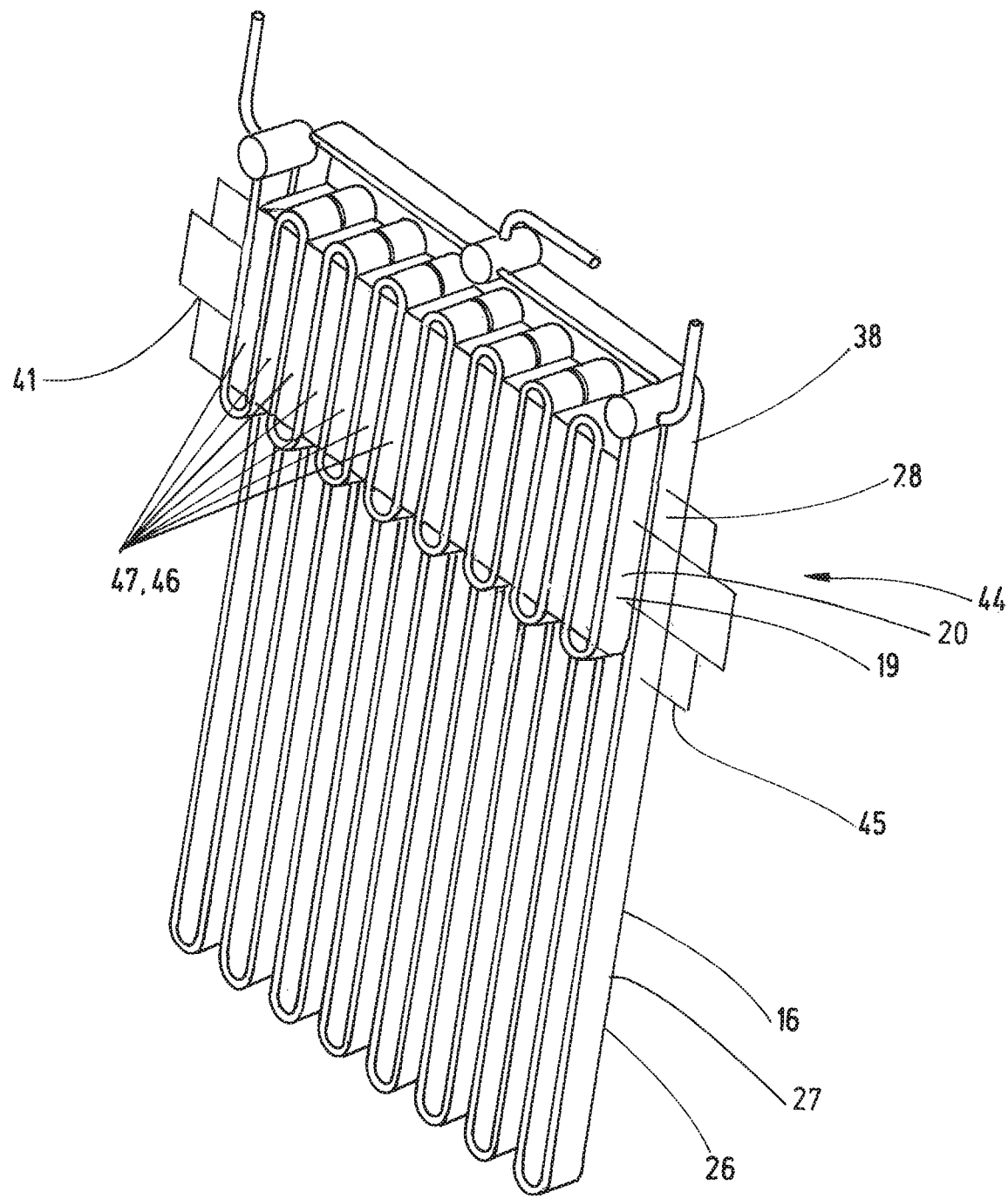
FIG. 3 shows a second configuration of a heat exchanger arrangement for a cooling system.

FIG. 3 shows another configuration of a heat exchanger arrangement 44 suitable for the cooling system 100 of FIG. 1. In the heat exchanger arrangement 44 according to FIG. 3, the pulsating heat pipe 16 comprises an evaporator 26 and a condenser 28. In contrast to the configuration of FIG. 2 the evaporator 19 of the second cooling circuit 17 is arranged in an imagined plane of extension 41, while the condenser 28 of the pulsating heat pipe 16 is disposed in an imagined second plane 45 parallel to the plane of extension 41. For the thermal coupling between the evaporator 19 of the second cooling circuit 17 and the condenser 28 of the pulsating heat pipe 16 heat sinks 46 are provided, which are configured as solid aluminum blocks 47. A more detailed description of the heat exchanger arrangement 44 according to FIG. 3 is provided in European patent application no. 19168012.3 of the applicant.

The cooling system 100 according to FIG. 1 can be operated in at least one of three cooling modii, which are explained in more detail with reference to FIG. 4.

The cooling system 100 can be operated in a first mode, the so called passive mode, which is chosen when an exterior temperature $T_{ex}$ is lower than an interior temperature $T_{in}$ of the electronics cabinet 10. In the passive mode only the pulsating heat pipe 16 is operated to transfer heat from the cabinet side compartment 12 to the exterior side compartment 13, i.e. the second cooling circuit 17 is not operated. In the passive mode the fans 33, 36 can be operated to circulate air through the cabinet side compartment 12 and through the external side compartment 13. However, it is also possible that the fans are not operated in the passive mode. Heat of airflow 48 circulating through the cabinet side partition is transferred to airflow 49 circulating through the external side partition 13 only via pulsating heat pipe 16. In the passive mode it is particularly advantageous when the first cooling circuit 15 and the second cooling circuit 17 are configured according to the heat exchanger arrangement 37 of FIG. 2, in which an airflow through the clearances 42 between the heat exchange structures 40 is possible.

The second cooling mode, the so-called hybrid mode, is chosen, when the exterior temperature $T_{ex}$ is lower than the interior temperature $T_{in}$ of the electronics cabinet 10, while at the same time the evaporation temperature $T_{evap}$ of the refrigerant in the second cooling circuit 17 is higher than the exterior temperature $T_{ex}$. In the hybrid mode both the passive cooling system of the pulsating heat pipe 16 and the active second cooling system 17 of the vapor compression cycle circuit 18 are operated and, preferably, both fans 33, 36 are running. The evaporation temperature $T_{evap}$ can be preferably adjusted to be higher than the exterior temperature $T_{ex}$ by setting the operating parameters of the compressor 21 of the second cooling circuit 17, thereby providing the conditions for the hybrid mode. In the hybrid mode, the evaporator 19 of the second cooling circuit 17 does not absorb heat from the airflow 49 in the external side partitionment 13, because the evaporation temperature $T_{evap}$ of the refrigerant in evaporator 19 is higher than the external temperature $T_{ex}$. However, evaporator 19 cools condenser 28 of heat pipe 16, thereby increasing the cooling effectivity of heat pipe 16 and the cooling system 100.

Figure 4:
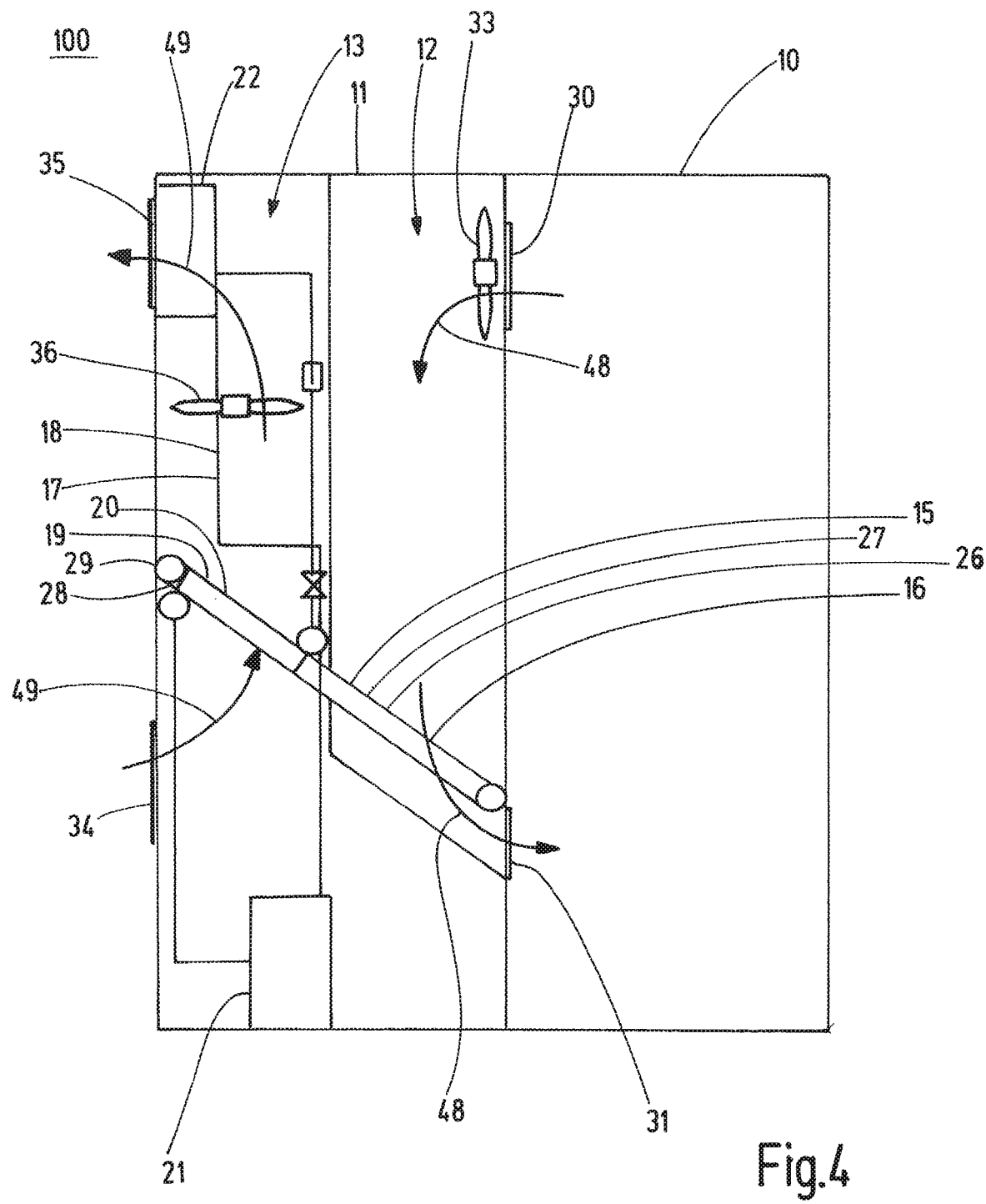
FIG. 4 shows the first configuration of the cooling system operated in a passive, a hybrid and an active mode.
Figure 5:
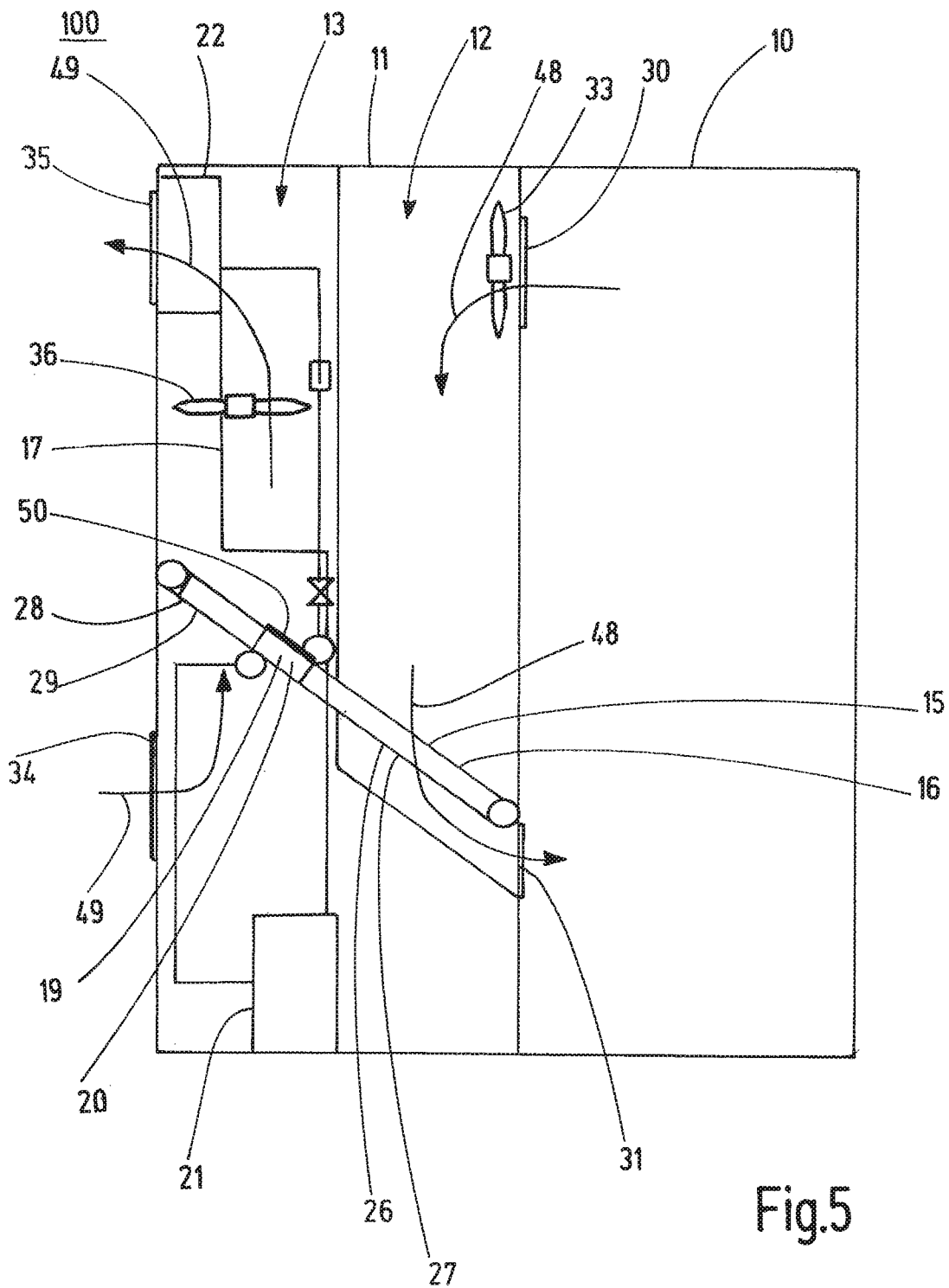
FIG. 5 shows a first configuration of the cooling system comprising an airflow regulation flap

In FIG. 5 a modification of the cooling system 100 of FIGS. 1 and 4 is shown. Cooling system 100 of FIG. 5 comprises an airflow regulation flap 50 connected swivelably to thermally coupled evaporator 19 and condenser 28. The thermal coupling between evaporator 19 and condenser 28 does not extend over the full length of condenser 28. In FIG. 5 the flow regulation flap 50 is in a closed position preventing airflow through evaporator 19 and thereby effectively thermally insulating evaporator 19 of the second cooling circuit 17 from airflow 49 in external side partitionment 13. Because of the thermal insulation, cooling system 100 can be operated in the hybrid mode, even if the evaporation temperature $T_{evap}$ of the refrigerant in evaporator 19 is lower than the exterior temperature $T_{ex}$, because heat from airflow 49 is not absorbed by evaporator 19.

Returning to FIG. 4 the third cooling mode, the so-called active mode, is described. The active mode is chosen, when the external temperature $T_{ex}$ is higher than the internal temperature $T_{in}$. In the active mode both the first cooling circuit 15, i.e. the pulsating heat pipe 16, and the second cooling circuit 17, i.e. the vapor compression cycle circuit 18, are operated. Since the external temperature $T_{ex}$ is higher than the internal temperature $T_{in}$, the passive cooling system 15 of the pulsating heat pipe 16 cannot transfer heat from the cabinet side partitionment 12 to the external side partitionment 13. In order to force heat transfer from the cabinet side partitionment 12 to the external side partitionment 13, the evaporator 19 of the second active cooling circuit 17 is used to cool the condenser 28 of pulsating heat pipe 16 in the external side partitionment 13 below the internal temperature $T_{in}$ in the cabinet side partitionment 12. The absorbed heat is released via condenser 22 of the second cooling circuit 17.

Figure 6:
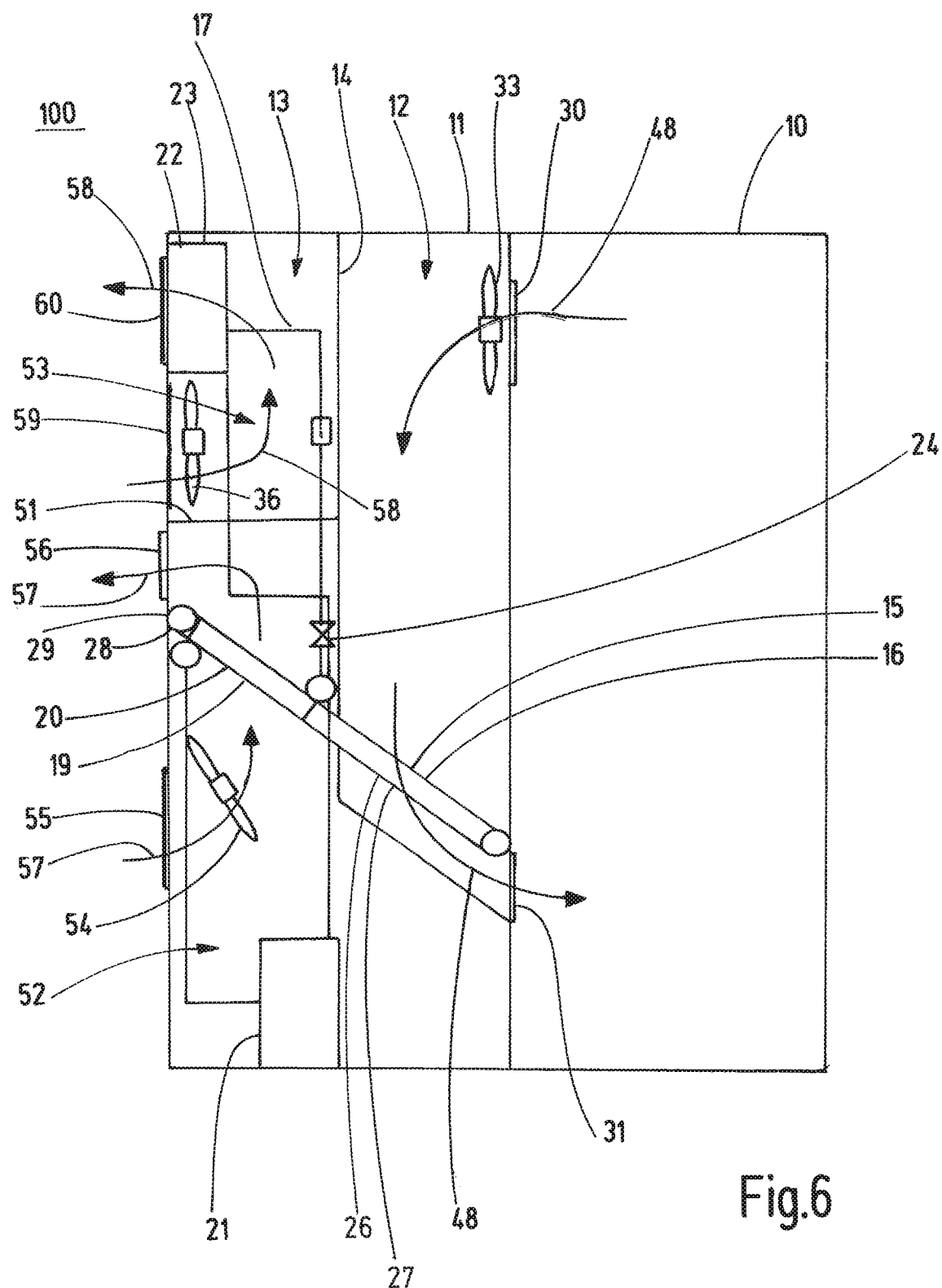
FIG. 6 shows a second configuration of the cooling system operated in a hybrid mode.

FIG. 6 shows a third configuration of the cooling system 100. The configuration shown in FIG. 6 differs from the configuration of FIG. 1 by an internal separation wall 51 in the external side partitionment 13. The separation wall 51 divides the external side partitionment 13 into a first volume 52 and a second volume 53. In the first volume 52 the evaporator 19, the expansion valve 24 and the compressor 21 of the second cooling circuit 17 as well as the condenser 28 of the first cooling circuit 15 are arranged. Furthermore, the first volume 52 holds third fan 54. The first volume 52 comprises an inlet opening 55 and an outlet opening 56 to allow airflow 57 circulation through the first volume 52. The second volume 53 comprises the condenser 22 of the second cooling circuit 17 as well as the second fan 36 to circulate airflow 58 through the second volume 53 via inlet opening 59 and outlet opening 60. FIG. 6 shows the hybrid mode operation of cooling system 100. In the hybrid mode both the first cooling circuit 15 and the second cooling circuit 17 are operated. To effectively remove heat from the first volume 52 and the second volume 53 both fans 36 and 54 are operated. In an alternative configuration, the evaporator 19 and condenser 28 may be configured as in FIG. 5 with the thermal coupling not extending over the full length of condenser 28 and further comprising an airflow regulation flap 50 to thermally insulate evaporator 19 from the air inside the first volume 52.

Figure 7:
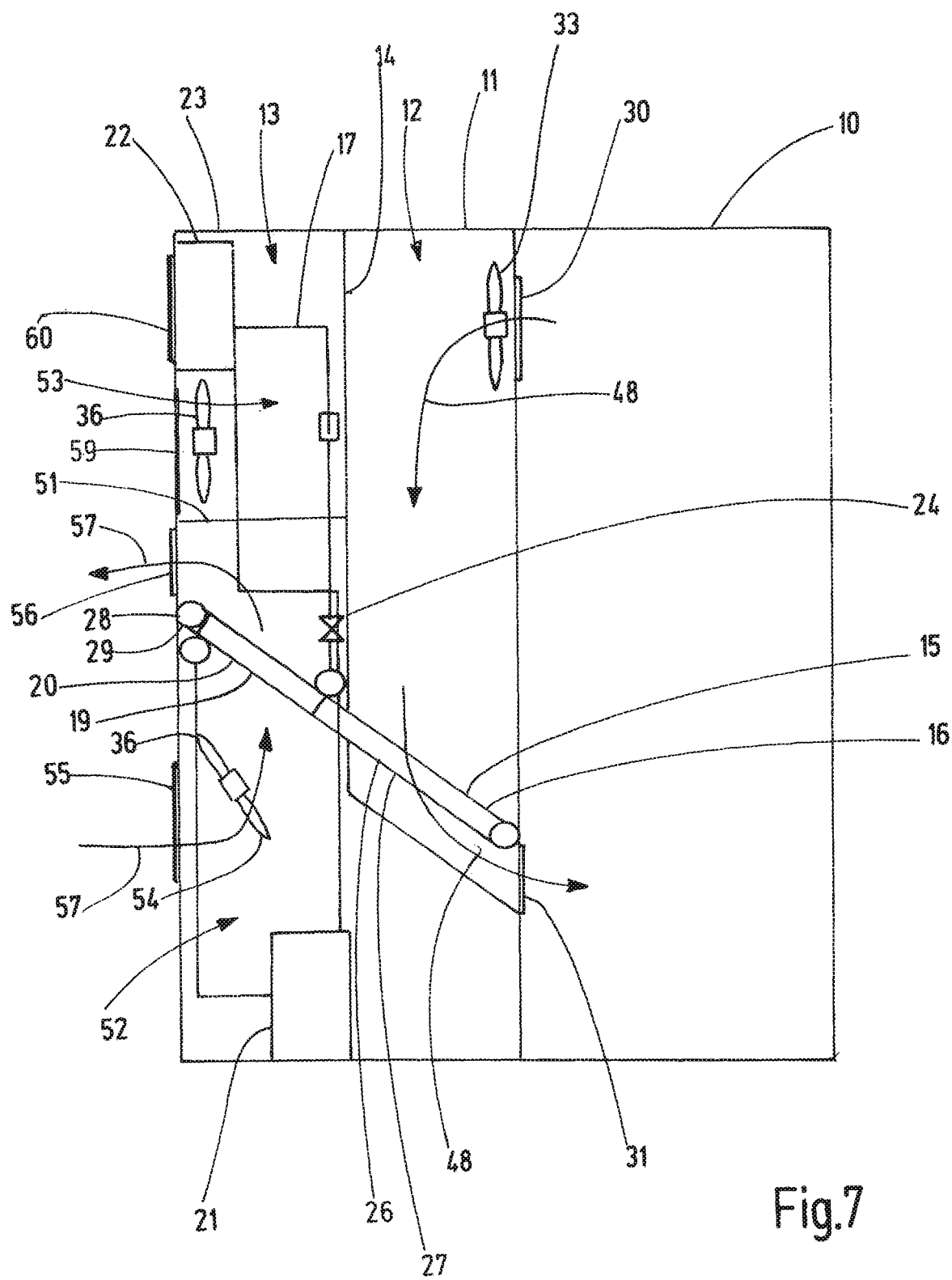
FIG. 7 shows the second configuration of the cooling system operated in a passive mode.

FIG. 7 shows the system 100 in the passive mode. In the passive mode the second cooling circuit 17 is not operated. Heat is only released via the condenser 28 of the first cooling circuit 15 disposed in the first volume 52. In the passive mode, second fan 36 is not necessarily running, because heat is not released from condenser 22 of second cooling circuit 17.

Figure 8:
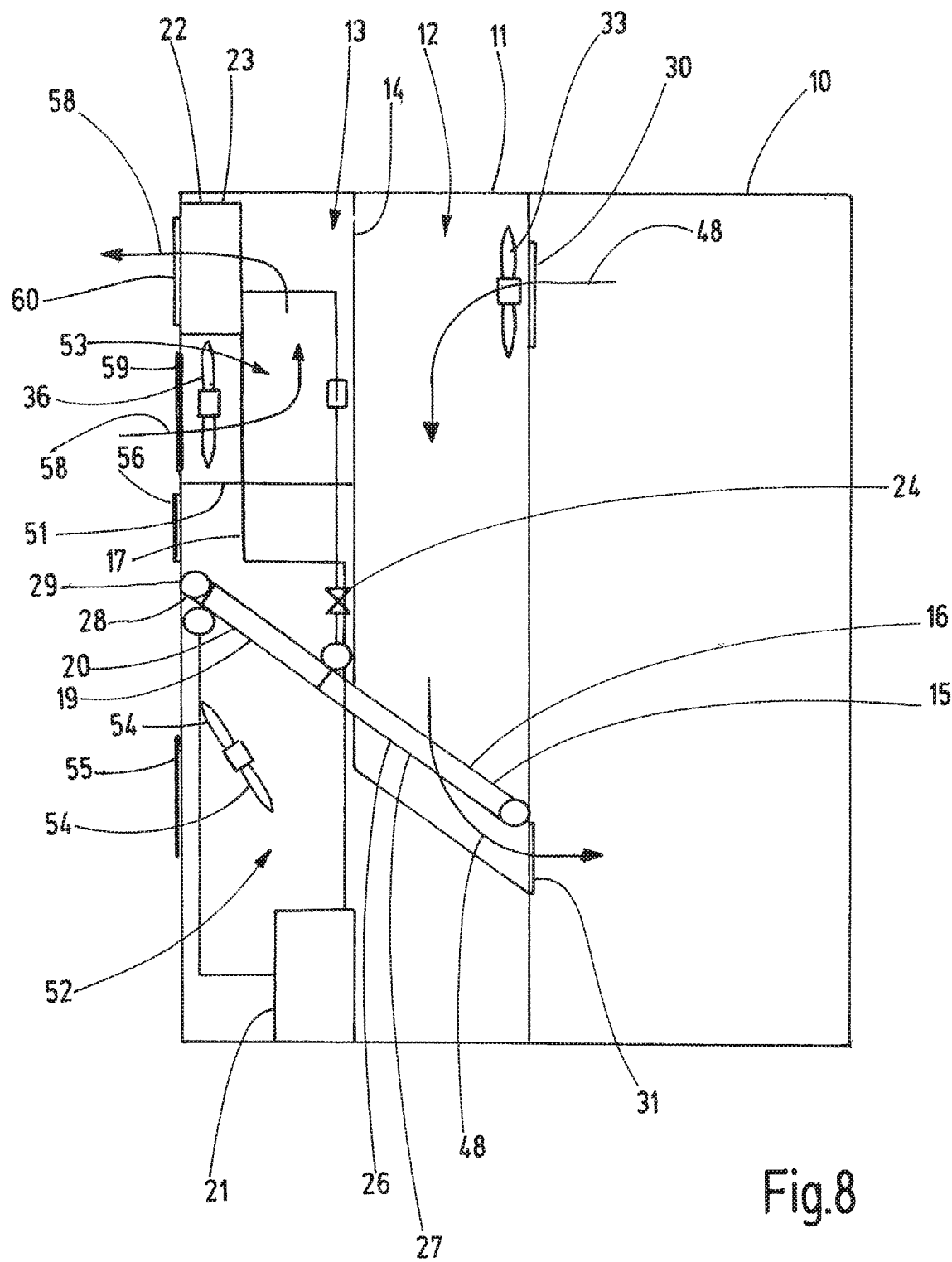
FIG. 8 shows the second configuration of the cooling system operated in an active mode.

FIG. 8 shows the system of FIGS. 6 and 7 in the active mode. In the active mode the fan 54 in the first volume 52 is not operated. Heat is only released via the condenser 22 of the second cooling circuit 17. Additionally, the inlet opening 55 and outlet opening 56 of the first volume 52 may be closed in the active mode with suitable flaps.

Figure 9:
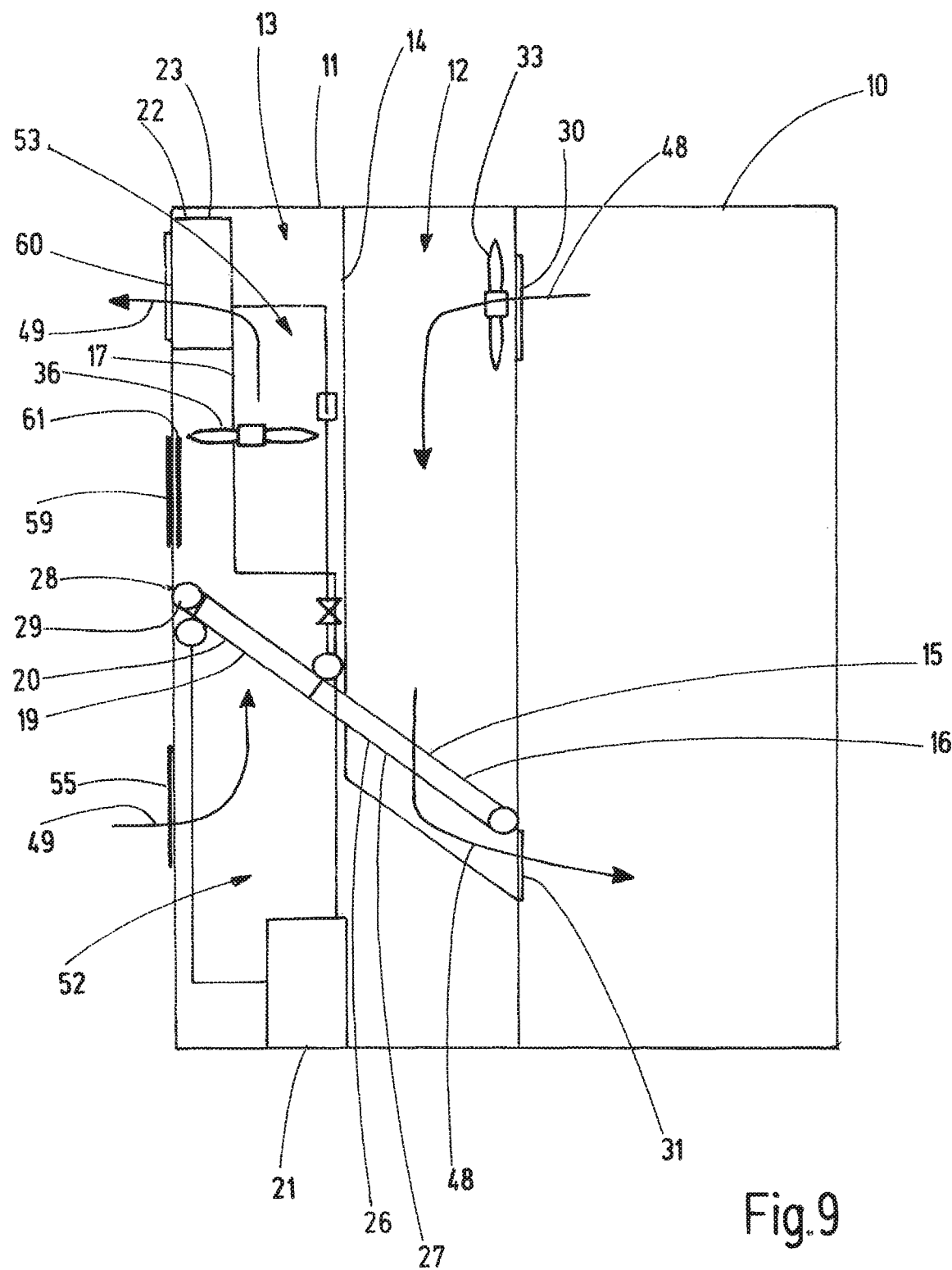
FIG. 9 shows a third configuration of the cooling system operated in a passive and in a hybrid mode.
Figure 10:
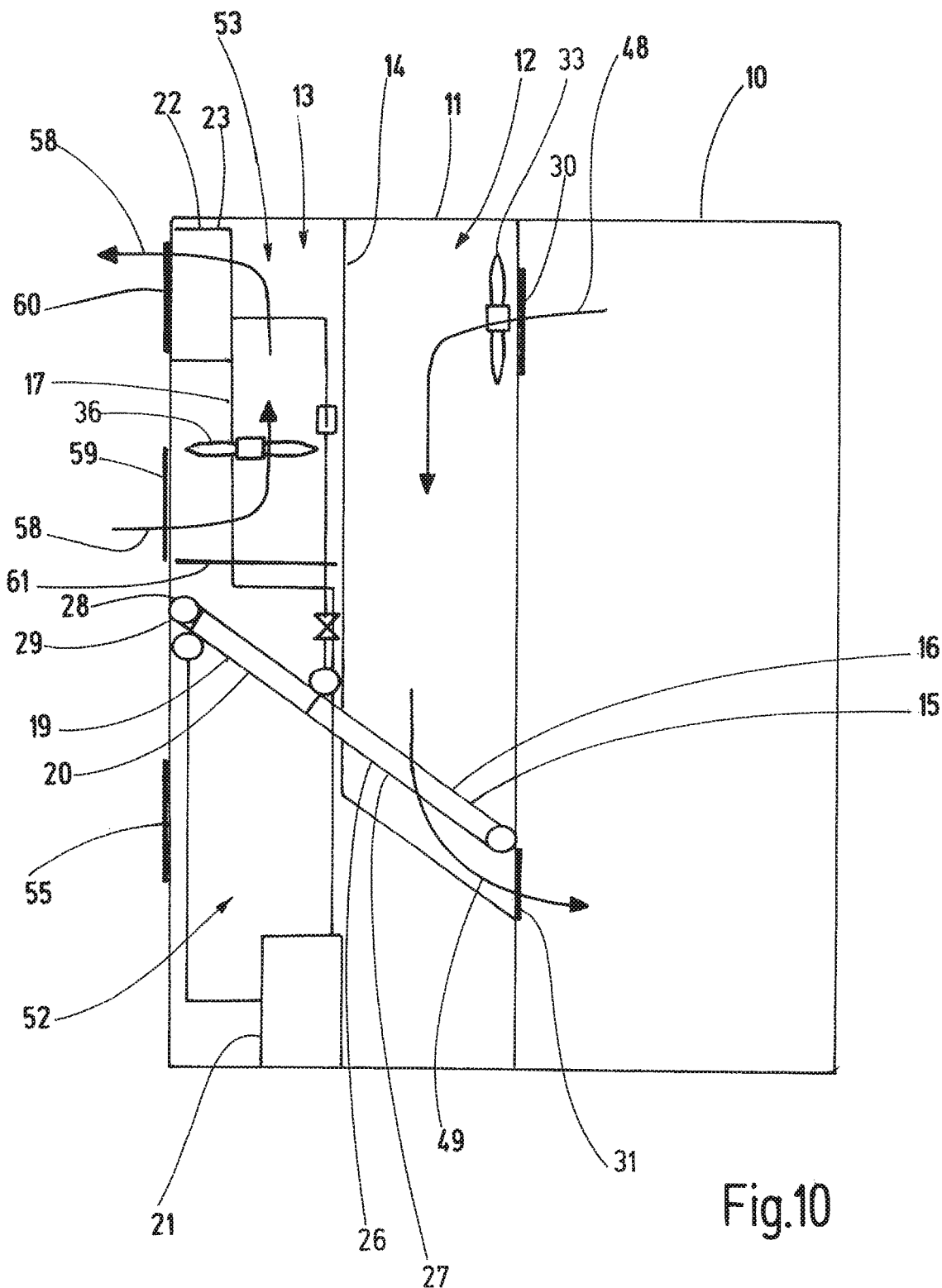
FIG. 10 shows the third configuration of the cooling system operated in an active mode.

FIG. 9 shows a third configuration of the cooling system 100. In contrast to the cooling system of FIGS. 1 and 4 to 8 a shutter flap 61 is provided, which in the shown open positioning preferably closes the inlet opening 59 of the second volume 53, and which in the closed position separates the external side partitionment 13 into a first volume 52 and a second volume 53 as shown in FIG. 10. Furthermore, the first volume 52 does not comprise a dedicated outlet opening.

In the passive and in the hybrid mode shutter flap 61 is in the open position as shown in FIG. 9 and the first fan 33 and the second fan 36 are operated to circulate airflows 48, 49 through the cabinet side partitionment 12 and the external side partitionment 13, respectively. The passive mode is operated when the external temperature $T_{ex}$ is lower than the internal temperature $T_{in}$ and the hybrid mode is chosen when in addition the evaporation temperature $T_{evap}$ of the refrigerant in evaporator 19 of the second cooling circuit 17 is preferably higher than the external temperature $T_{ex}$.

FIG. 10 shows the configuration of cooling system 100 of FIG. 9 in the active mode. In the active mode the shutter flap 61 is in the closed position so that the external side partitionment 13 is separated into the first volume 52 and the second volume 53. In the active mode, the first fan 33 and the second fan 36 are operated. Because of the closed shutter flap 61 airflow 58 circulates only through the second volume 53 to transfer heat released from condenser 22 of the second cooling circuit 17 to the outside of casing 11.

In the configuration of FIGS. 9 and 10, the thermal coupling between evaporator 19 of second cooling circuit 17 and condenser 28 of first cooling circuit 15 can be configured as in the configuration of FIG. 5, where the thermal coupling does not extend over the full length of condenser 28. An airflow regulation flap 50 might be provided as well.

FIGS. 11 to 13 show variations of the configurations of first cooling circuit 15 and second cooling circuit 17, which can be applied to each of the configurations of FIGS. 1 and 4 to 10 in any suitable combination.

In FIG. 11 the first cooling circuit 15 is configured as a thermosiphon 62. Evaporator 63 of thermosiphon 62 in cabinet side partitionment 12 is connected to condenser 64 of thermosiphon 62 in the external side partitionment 13 via fluid lines 65. Evaporator 63 of thermosiphon 62 and condenser 64 are physically separated from each other. Similarly to the configuration of FIG. 5, cooling system 100 of FIG. 11 comprises an airflow regulation flap 50 connected swivellably to thermally coupled evaporator 19 and condenser 64. The airflow regulation flap 50 is shown in an open position allowing airflow through evaporator 19 and condenser 64. The thermal coupling between evaporator 19 and condenser 64 does not extend over the full length of condenser 64.

FIG. 12 shows a configuration similar to FIG. 11. However, the thermal coupling of evaporator 19 and condenser 64 does extend over the full length of condenser 64 and no airflow regulation flap 50 is provided.

In the configuration of FIG. 13, first cooling circuit 15 is a water cooling circuit 66 comprising a pump 67. Instead of water the first cooling circuit 15 may comprise a different coolant or refrigerant.

Figure 14:
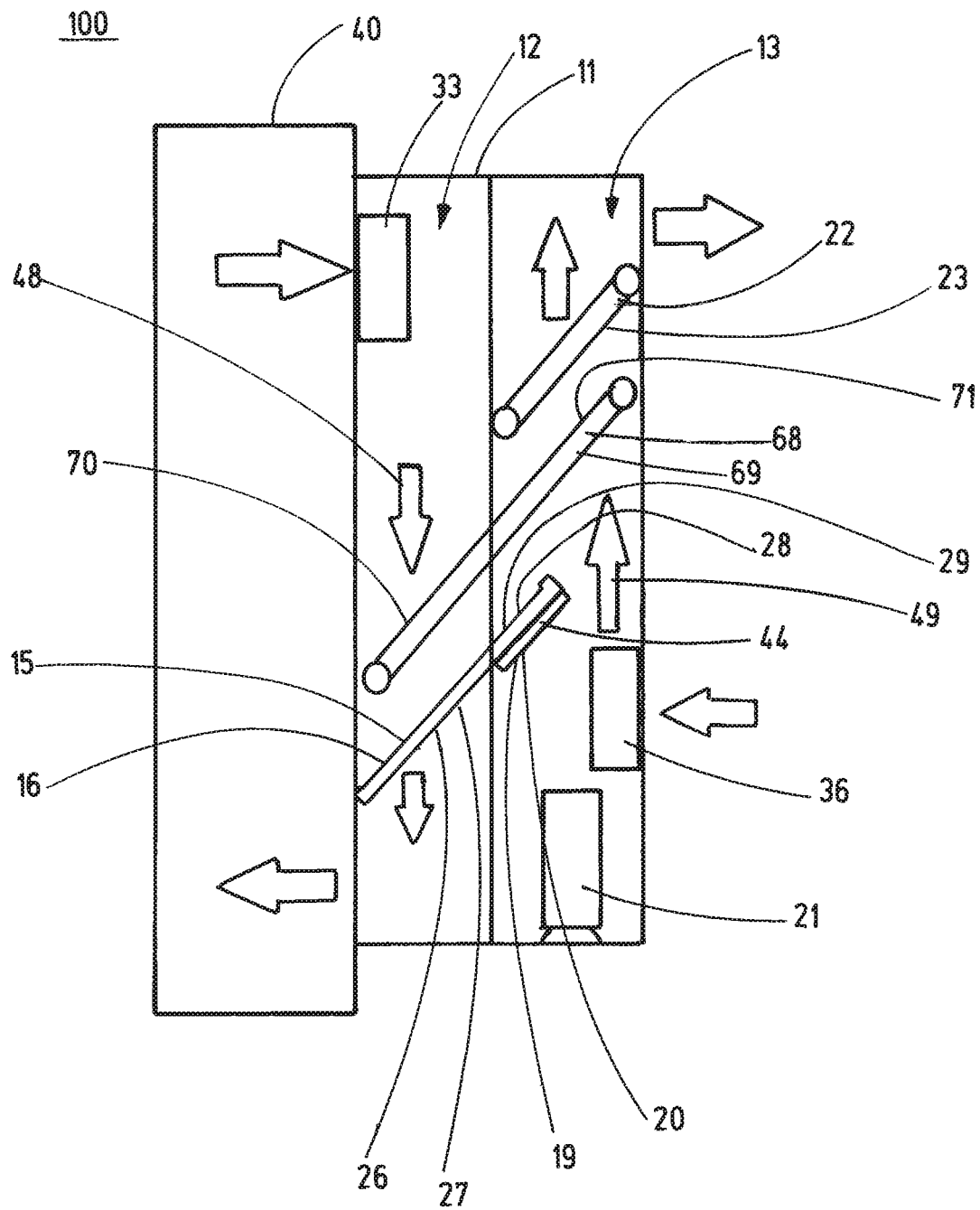
FIG. 14 shows a seventh configuration of the cooling system comprising a third cooling circuit.

FIG. 14 shows another configuration of the cooling system 100. Cooling system 100 of FIG. 14 comprises a third cooling circuit 68, which is configured as a pulsating heat pipe 69. The cooling system 100 furthermore comprises the heat exchanger arrangement 44 of FIG. 3, in which the evaporator 19 of the second cooling circuit 17 is arranged in parallel to the condenser 28 of the first cooling circuit 15 and thermally connected to the condenser 28 of the first cooling circuit 15 via heat sinks 46. Heat sinks 46 prevent air from flowing through the evaporator 19 and condenser 28. To improve the effectivity of the passive cooling mode the third cooling circuit 68 is provided. First fan 33 creates airflow 48 in cabinet side partitionment 12 and second Fan 36 creates airflow 49 in external side partitionment 13. A heat absorbing heat exchanger section 70 of the third cooling circuit 68 is arranged in the cabinet side partitionment 12 in flow direction of the airflow 48 in front of the heat absorbing heat exchanger section 27 of the first cooling circuit 15 and a heat releasing heat exchanger section 71 of the third cooling circuit 68 is arranged in the external side partitionment 13 in flow direction of the airflow 49 behind the heat releasing heat exchanger section 29 of the first cooling circuit 15 and behind the heat absorbing heat exchanger section 20 of the second cooling circuit 17.

The invention claimed is:

1. A cooling system for electronics cabinets, comprising:
a casing including a cabinet side partitionment, a first cooling circuit, and a second cooling circuit,
wherein the second cooling circuit is an active cooling circuit and the second cooling circuit is not disposed in the cabinet side partitionment,
the second cooling circuit is a vapor compression cycle circuit and the second cooling circuit includes a combustible refrigerant with a Global Warming Potential (GWP) of less than 1,000,
the first cooling circuit includes a heat absorbing heat exchanger section arranged in the cabinet side partitionment and a heat releasing heat exchanger section not disposed in the cabinet side partitionment,
wherein the second cooling circuit includes a heat absorbing heat exchanger section,
wherein the heat absorbing heat exchanger section of the second cooling circuit is thermally coupled to the heat releasing heat exchanger section of the first cooling circuit, such that heat absorbed from the heat absorbing heat exchanger section of the first cooling circuit in the cabinet side partitionment is transferred via the heat releasing heat exchanger section of the first cooling circuit outside the cabinet side partitionment to the heat absorbing heat exchanger section of the second cooling circuit, and
wherein the cabinet side partitionment includes a partition wall separating the electronics cabinet and the cabinet side partitionment, the partition wall including one inlet opening for inflow of air from an interior of the electronics cabinet and an outlet opening for outflow of air into the electronics cabinet.

2. The cooling system according to claim 1, wherein the first cooling circuit is a passive cooling circuit or an active cooling circuit, and/or wherein refrigerant has a Global Warming Potential (GWP) of less than 100, wherein the refrigerant is a hydrocarbon and/or wherein the first cooling circuit is a fluid cooling circuit or a water cooling circuit, or a heat pipe, a thermosiphon or a pulsating heat pipe.

3. The cooling system according to claim 2, wherein the refrigerant has a Global Warming Potential (GWP) of less than 10.

4. The cooling system according to claim 3, wherein the refrigerant has a Global Warming Potential (GWP) of less than 3.

5. The cooling system according to claim 1, wherein the heat absorbing heat exchanger section of the second cooling circuit and the heat releasing heat exchanger section of the first cooling circuit form a heat exchanger arrangement, wherein the heat exchanger arrangement includes a plurality of heat exchange structures which are arranged in parallel to each other, in a plane of extension, wherein the heat absorbing heat exchanger section of the second cooling circuit includes a first plurality of fluid guiding means and wherein the heat releasing heat exchanger section of the first cooling circuit includes a second plurality of fluid guiding means, wherein each heat exchange structure includes at least one fluid guiding means of the first plurality and at least one fluid guiding means of the second plurality thermally coupled to each other, and arranged in parallel to each other, wherein a clearance is disposed between two adjacent heat exchange structures to allow airflow between the adjacent heat exchange structures and/or wherein each heat exchange structure includes a heat sink to thermally couple the at least one fluid guiding means of the first plurality and the at least one fluid guiding means of the second plurality.

6. The cooling system according to claim 1, wherein the casing includes an external side partitionment separated by a gas tight internal partition wall from the cabinet side partitionment, wherein the heat absorbing heat exchanger section of the second cooling circuit is disposed only in the external side partitionment.

7. The cooling system according to claim 6, wherein the heat releasing heat exchanger section of the first cooling circuit is disposed in the external side partitionment.

8. The cooling system according to claim 1, wherein the external side partitionment includes at least one inlet opening for inflow of air from an external side and at least one outlet opening for outflow of air to the external side of the electronics cabinet.

9. An electronics cabinet with a cooling system, comprising: a casing, wherein the casing comprises at least-a cabinet side partitionment, wherein the cooling system comprises a first cooling circuit and a second cooling circuit,
wherein the second cooling circuit is an active cooling circuit and the second cooling circuit is not disposed in the cabinet side partitionment,
the second cooling circuit is a vapor compression cycle circuit and the second cooling circuit includes a combustible refrigerant with a Global Warming Potential (GWP) of less than 1,000,
the first cooling circuit includes a heat absorbing heat exchanger section arranged in the cabinet side partitionment and a heat releasing heat exchanger section not disposed in the cabinet side partitionment,
wherein the second cooling circuit includes a heat absorbing heat exchanger section, wherein the heat absorbing heat exchanger section of the second cooling circuit is thermally coupled to the heat releasing heat exchanger section of the first cooling circuit, such that heat absorbed from the heat absorbing heat exchanger section of the first cooling circuit in the cabinet side partitionment is transferred via the heat releasing heat exchanger section of the first cooling circuit outside the cabinet side partitionment to the heat absorbing heat exchanger section of the second cooling circuit and
wherein the cabinet side partitionment includes a partition wall separating the electronics cabinet and the cabinet side partitionment, the partition wall including one inlet opening for inflow of air from an interior of the electronics cabinet and an outlet opening for outflow of air into the electronics cabinet.

\* \* \* \* \*